United States Patent [19]

Andou

[11] Patent Number: 4,720,130
[45] Date of Patent: Jan. 19, 1988

[54] INDUSTRIAL ROBOT HAND WITH POSITION SENSOR

[75] Inventor: Yukinori Andou, Tenri, Japan

[73] Assignee: Sharp Kabushiki Kaisha, Osaka, Japan

[21] Appl. No.: 4,844

[22] Filed: Jan. 12, 1987

Related U.S. Application Data

[63] Continuation of Ser. No. 713,831, Mar. 20, 1985, abandoned.

[30] Foreign Application Priority Data

Mar. 21, 1984 [JP] Japan .................. 59-41039[U]

[51] Int. Cl.$^4$ .................. B25J 15/06; B25J 19/02
[52] U.S. Cl. .................. 294/64.1; 294/907; 901/40; 901/46
[58] Field of Search .................. 294/1.1, 64.1-64.3, 294/66.2, 86.4, 907; 29/743; 248/362, 363; 269/21; 414/121, 729, 730, 737, 744 B, 752; 901/30-33, 35, 40, 46, 47

[56] References Cited

U.S. PATENT DOCUMENTS

| | | | |
|---|---|---|---|
| 3,223,442 | 12/1965 | Fawdry et al. | 294/64.1 |
| 4,266,905 | 5/1981 | Birk et al. | 294/64.1 X |
| 4,423,998 | 1/1984 | Inaba et al. | 294/907 X |
| 4,441,817 | 4/1984 | Pryor | 901/47 X |
| 4,451,197 | 5/1984 | Lange | 294/64.1 X |
| 4,463,980 | 8/1984 | Orii | 294/64.1 |
| 4,493,606 | 1/1985 | Foulke et al. | 294/64.1 X |
| 4,603,897 | 8/1986 | Foulke et al. | 294/64.1 |

FOREIGN PATENT DOCUMENTS

| | | | |
|---|---|---|---|
| 53-4964 | 1/1978 | Japan | 294/907 |
| 423623 | 9/1974 | U.S.S.R. | 901/47 |
| 779068 | 11/1980 | U.S.S.R. | 294/66.2 |

*Primary Examiner*—Johnny D. Cherry
*Attorney, Agent, or Firm*—Birch, Stewart, Kolasch & Birch

[57] ABSTRACT

A robot for transporting a semiconductor wafer comprises a robot hand for engaging and retaining a semiconductor wafer, and at least one position sensor for detecting whether the semiconductor wafer is present at a predetermined position on the robot hand. The robot hand includes a first support plate for supporting the retained semiconductor wafer and a second support plate provided with the at least position sensor for supporting the first support plate.

8 Claims, 7 Drawing Figures

To Forced Exhaust System

INDUSTRIAL ROBOT HAND WITH POSITION SENSOR

This application is a continuation of application Ser. No. 713,831 filed on Mar. 20, 1985 and now abandoned.

BACKGROUND OF THE INVENTION

The present invention relates to an industrial robot and, more particularly, to a robot hand of an industrial robot which can judge whether a member to be transported is positioned at a correct position on the robot hand.

In conventional semiconductor manufacturing steps, the composition critical to performance of semiconductor wafers must be seriously controlled. Therefore, it is necessary to load or transport each semiconductor wafer from one jig to another in an environment free of mixing impurity. However, such a suitable device is not available. Further, the conventional transport means is not equipped with a position sensing means. Therefore, the semiconductor wafer may be damaged or broken by striking against a carrier cassette or a heat treating boat when the semiconductor wafer is loaded or unloaded onto the wafer receiving portion of the heat treating boat or the carrier cassette.

When the semiconductor wafer is damaged, the semiconductor wafer may be defective, or fine dust may be produced. Thus, the environment in the manufacturing factory may be harmed.

Accordingly, it is desired that an improved robot hand be provided which detects whether the semiconductor wafer is positioned at the correct or a predetermined position.

If it is not detected whether the position of the semiconductor wafer is correct or incorrect, it is difficult to utilize an automatic semiconductor manufacturing system.

SUMMARY OF THE INVENTION

Accordingly, it is an object of the present invention to provide an improved robot which transports a semiconductor wafer with a wafer position sensing operation.

It is another object of the present invention to provide an improved robot hand which senses the position of a semiconductor wafer applied on the robot hand without damaging the performance of the semiconductor wafer.

It is still another object of the present invention to provide an improved robot hand which holds a semiconductor wafer on a robot hand by vacuum and judges whether the semiconductor wafer is present or absent at a predetermined position on the robot hand.

It is a further object of the present invention to provide an improved robot hand which stops the operation of the robot hand when a semiconductor wafer is absent from a predetermined position on the robot hand.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above object, according to an embodiment of the present invention, a robot for transporting a semiconductor wafer comprises robot hand means for engaging and retaining a semiconductor wafer, and position sensing means for detecting whether the semiconductor wafer is present at a predetermined position on the robot hand. The robot hand means includes first support means for supporting the absorbed semiconductor wafer and second support means provided with said position sensing means for supporting the first support means. The second support means has a projection for supporting the first support means, and the first supporting means has a hole perforated through the first support means, so that the projection of the second support means is inserted into the hole of the first support means to support the first support means on the second support means.

The second support means has a groove connected to first vacuum producing means so that the first support means is held by vacuum on the second support means through the groove. The projection of the second supporting means has a cavity portion connected to second vacuum producing means so that the semiconductor wafer is held by vacuum over the projection of the second support means.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
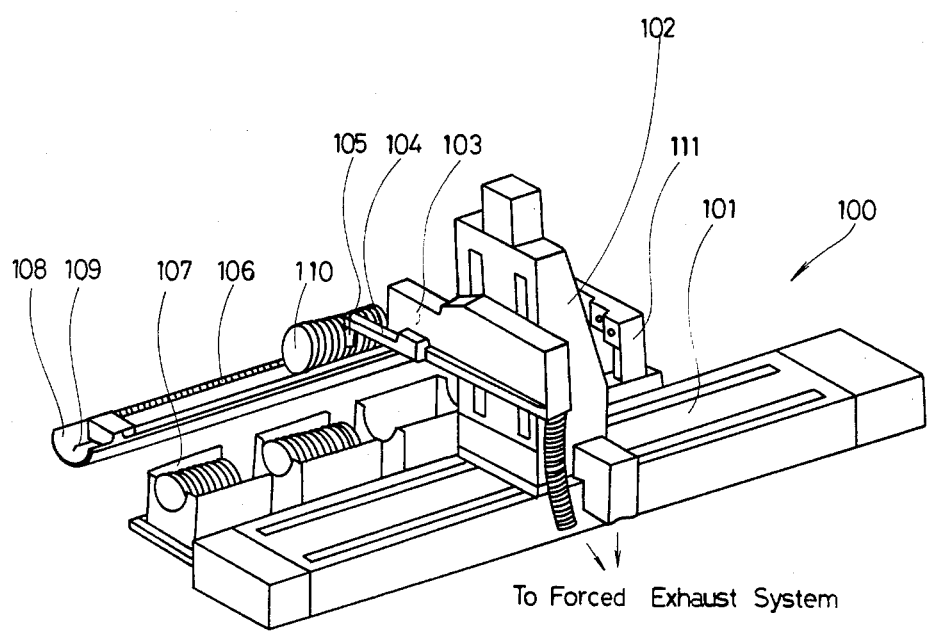
FIG. 1 shows a perspective view of a wafer loading and unloading robot system using a robot hand according to an embodiment of the present invention in the case where a semiconductor wafer is loaded from a heat treating boat to a carrier cassette, and vice versa.

In embodiments of the present invention, a robot hand of the present invention is applied to a wafer loading/unloading robot in which a plurality of semiconductor wafers to be diffused by a diffusion device for a diffusion process of semiconductor manufacturing steps are subsequently transported from a carrier cassette to a diffusion boat (or a heat treating boat), and vice versa. But, the present invention is not limited to a semiconductor wafer loading/unloading robot in the diffusion process of the semiconductor manufacturing steps.

A robot 100 comprises a table 101, a slide bed 102, an arm holder 103, an arm 104, and a robot hand 105. The slide bed 102 is slidably reciprocated along the table 100 in a direction X. The arm holder 103 is reciprocately moved in the vertical direction (in other words, in a direction Y) along the slide bed 102. The arm 104 is slidably reciprocated in the horizontal direction (in other words, in a direction Z) along the arm holder 103. The robot hand 105 is provided at the end of the arm 104. A diffusion boat, for example, made of quartz glass, for the diffusion process is designated by numeral 106. A carrier cassette is designated by numeral 107. The diffusion boat 106 is slidably moved along a boat guide 108 and provided with wafer support grooves each having a predetermined width, so that each of the semiconductor wafers 110 is stored in a groove. After the semiconductor wafers 110 are carried on the diffusion boat 106 from the carrier cassette 107, the diffusion boat 106 is positioned in a furnace of the diffusion device by being slidably moved on a guide rail 109 along the boat guide 108 to diffuse the plurality of semiconductor wafers by the furnace of the diffusion device. After the diffusion process is carried out, the diffusion boat 106 is taken out from the furnace of the diffusion device and said each semiconductor wafer 110 is loaded on the carrier cassette 107 from the diffusion boat 106.

The diffusion device for the diffusion process of the semiconductor manufacturing steps generally includes a plurality of furnaces, preferably, four. The operations of the furnaces are different from each other.

Figure 2:
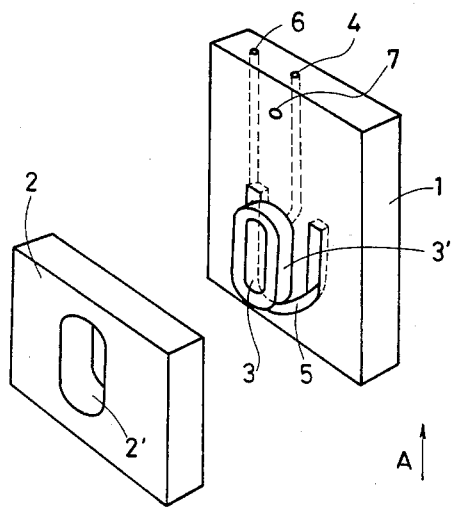
FIG. 2 shows a perspective view of a robot hand according to a preferred embodiment of the present invention when the robot hand is divided into two parts.

Referring to FIG. 2, the robot hand 105 comprises a robot hand main body 1 and a wafer seat plate 2. The robot hand main body 1 includes a U-shaped groove 5 provided at the front surface of the main body 1, and an O-shaped projection 3' projected from the front surface of the main body 1 surounded by the U-shaped groove 5. A vacuum passage 6 is provided in the main body 1 for enabling the retaining the wafer seat plate 2 on the front surface of the main body 1 and one end of the vacuum passage 6 is communicated with the U-shaped groove 5. The other end of the absorbing path 6 is connected to a vacuum absorbing mechanism including at least one vacuum producing pump. A vacuum passage 4 is provided in the main body 1 for enabling the holding of the semiconductor wafer on the wafer seat plate 2 and one end of the vacuum passage 4 is communicated with the front surface of the main part 1 surrounded by the O-shaped projection 3'. The other end of the vacuum passage 4 is connected to the vacuum producing mechanism. The vacuum passages 4 and 6 are connected to different vacuum producing pumps. The vacuum passages 4 and 6 may be connected to a single vacuum producing pump of the vacuum producing mechanism if it is so desired.

The wafer seat plate 2 has a hole 2' perforated through the plate 2 so that the projection 3' of the main body 1 is inserted into the hole 2' to temporarily position the wafer seat plate 2 on the main body 1. The wafer seat plate 2 is temporarily positioned on the main body 1 with the engagement of the projection 3' and the hole 2'. The wafer seat plate 2 and the main body 1 are closely attached by vacuum from the vacuum producing mechanism through the U-shaped groove 5 and the vacuum passage 6.

The diffusion device in the semiconductor manufacturing steps generally includes a plurality of furnaces, preferably, four. The operations of the furnaces are different from each other. To prevent the contamination of the inside of each furnace, in the present invention separate wafer seat plates 2 are provided for each furnace. The change of the wafer seat plate 2 is carried out at a plate changing portion 111 as shown in FIG. 1.

The length in the direction of an arrow A of the main body 1 is more than that of the wafer seat plate 2. The depth of the wafer seat plate 2 is more than that of the projection 3'.

The semiconductor wafer 110 is in contact with the front surface of the wafer seat plate 2 when the semiconductor wafer 110 is held by the vacuum producing mechanism through the vacuum passage 4 and the cavity portion 3 of the O-shaped projection 3' and the hole 2' of the wafer seat plate 2.

Figure 3:
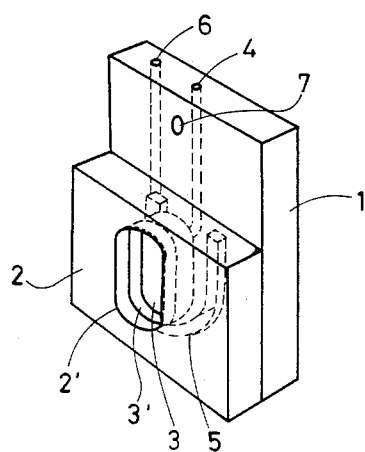
FIG. 3 shows a perspective view of a robot hand according to a preferred embodiment of the present invention when the two parts of the robot hand are combined with each other.

FIG. 3 shows a perspective view of the robot hand of FIG. 2 when the main body 1 is combined with the wafer seat plate 2. In this condition, the hole 2' of the wafer seat plate 2 is engaged with the O-shaped projection 3' of the main body 1 to temporarily position the wafer seat plate 2 on the main body 1, and the wafer seat plate 2 is held by the vacuum producing mechanism including at least one vacuum pump through the vacuum passage 6 and the U-shaped groove 5, so that the wafer seat plate 2 is perfectly supported by the main body 1. In this case, the cavity portion 3 of the O-shaped projection 3' of the main body 1 communicated with the vacuum passage 4 is placed in a condition to hold the semiconductor wafer 110 when the vacuum producing mechanism is driven.

The robot hand main body 1, further, includes a wafer position sensor 7, for example, a reflection type photosensor or an optical fiber sensor. The wafer position sensor 7 is provided at the upper portion of the main body 1 where the wafer seat plate 2 is not in contact with the main body 1. In other words, the wafer position sensor 7 is provided at the main body 1 which is above the position of the upper edge of the wafer seat plate 2, and is positioned on the center line of the main body 1 in the direction of an arrow A.

Although the main body 1 and the wafer seat plate 2 are separately provided, the wafer seat plate 2 may be integrally provided with the main body 1. When the wafer seat plate 2 is separately provided from the main body 1, only the wafer seat plate 2 is made of chemically stable and high-cost material, and the main body 1 may be manufactured of a low-cost material because only the wafer seat plate 2 is attached to the semiconductor wafer 110. The total cost of the robot hand 105 may be reduced. On the other hand, when the wafer seat plate 2 is integrally provided with the main body 1, the total cost of the robot hand 105 may be slightly increased, but the operation of the robot hand 105 is not changed. Preferably, the wafer seat plate 2 is made of glass, and the main body 1 is made of aluminum. The material of the wafer seat plate 2 and the main body 1 should not, however, be limited to glass and aluminum, respectively, The operation of the robot hand 105 according to the preferred embodiment of the present invention will be described with reference to FIGS. 4(A) and 4(B).

When the vacuum producing mechanism including at least one vacuum pump connected to the vacuum passage 4 is driven, the semiconductor wafer 110 is held and attached to the wafer seat plate 2 by the vacuum producing operation.

In the preferred embodiment of the present invention, the reflection type photosensor including a light emitting element and a light receiving element is used as the wafer position sensor.

Figure 4A:
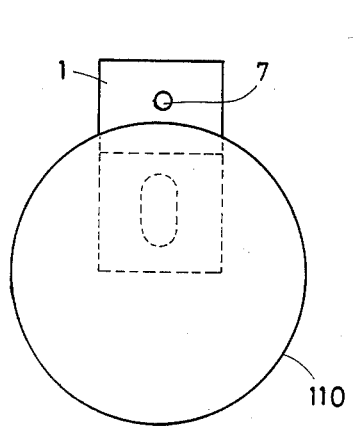
FIGS. 4(A) and 4(B) show plan views for explaining an operation of the robot hand of FIGS. 2 and 3.
Figure 4B:
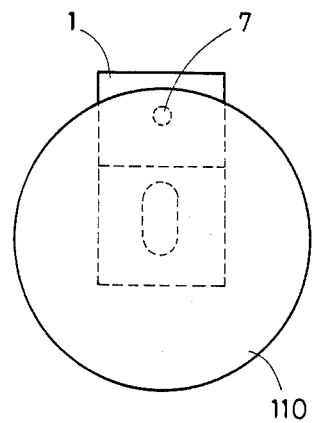

When the semiconductor wafer 110 is positioned at the predetermined position, that is a correct position, on the front surface of the wafer seat plate 2 as shown in FIG. 4(A), light emitted from the light emitting element of the reflection type photosensor 7 is not interrupted by the semiconductor wafer 110, and the light receiving element of the reflection type photosensor cannot receive the reflected light, so that the robot hand 105 with the semiconductor wafer 110 is moved from one jig to another to load the semiconductor wafer 110.

If the absorbed semiconductor wafer 110 is covered over the reflection type photosensor 7, the light emitted from the light emitting element of the reflection type photosensor 7 is interrupted by the absorbed semiconductor wafer 110 and is reflected in the direction of the light receiving element of the light reflection type photosensor 7. When the light receiving element receives the reflected light, it is judged that the semiconductor wafer 110 is not positioned at the correct position. The signals of the light receiving element of the reflection type photosensor 7 are changed to electric signals, and the electric signals are applied to the control circuit of the robot 100, so that the operation of the robot hand 105 is stopped by the control circuit. In a condition wherein the semiconductor wafer 110 is absent from the correct position on the wafer seat plate 2, the semiconductor wafer 110 is not transported to a next step.

Figure 5:
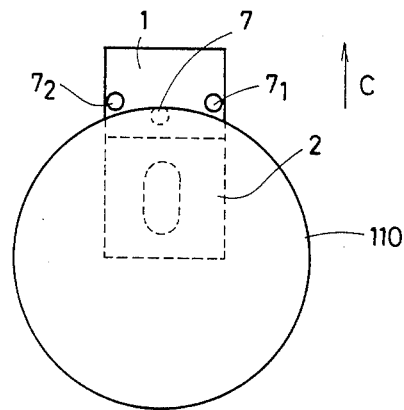
FIG. 5 shows a perspective view of a robot hand according to another embodiment of the present invention.

FIG. 5 shows a perspective view of a robot hand having a plurality of wafer position sensors according to another embodiment of the present invention.

The robot hand main body 1 includes three reflection type photosensors 7, $7_1$ and $7_2$. The reflection type photosensor 7 is provided at a position on the main body 1 which is above the position of the upper edge of the wafer seat plate 2, and is positioned on the center line of the main body 1 in the direction of an arrow C. The two reflection type photosensors $7_1$ and $7_2$ are symmetrically positioned on either side of the center line of the main body 1 in the direction of the arrow C. The wafer position sensors 7, $7_1$ and $7_2$ are staggered. The position of the reflection type photosensor 7 is lower than that of the pair of reflection type photosensors $7_1$ and $7_2$. The positions of the sensor 7 and the pair of sensors $7_1$ and $7_2$ can be replaced with other positions.

When the light emitted from the light emitting element of the reflection type photosensor 7 is interrupted by the held semiconductor wafer 110 and the reflected light is received by the light receiving element of the reflection type photosensor 7, and the light emitted from the pair of reflection type photosensors $7_1$ and $7_2$ is not interrupted by the held semiconductor wafer 110, it is judged that the held semiconductor wafer 110 is positioned at the correct position on the wafer seat plate 2. In this case, the robot hand 105 is continuously operated and the held wafer 110 is transported from the carrier cassette 107 to the diffusion boat 106.

When the light emitted from the light emitting element of the reflection type photosensor 7 is not interrupted by the held semiconductor wafer 110, it is judged that the semiconductor wafer 110 is absent from the correct position on the wafer seat plate 2. In this case, the robot hand control circuit is operated so that the operation of the robot hand is stopped.

Also, when the light emitted from said at least one of the reflection type photosensors $7_1$ and $7_2$ is interrupted by the held semiconductor wafer 110, it is detected that the semiconductor wafer 110 is absent from the correct position on the wafer seat plate 2, so that operation of the robot hand 105 is stopped.

As shown in FIG. 5, if the space between the reflection type photosensor 7 and the pair of reflection type photosensors $7_1$ and $7_2$ is suitably predetermined, i.e., narrowed, the position of the semiconductor wafer 110 can be judged exactly.

Figure 6:
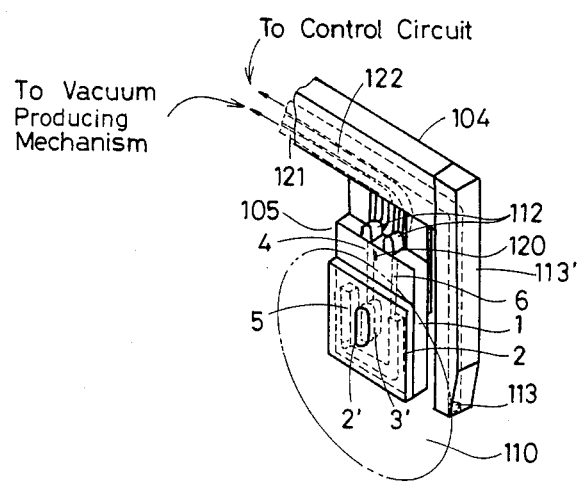
FIG. 6 shows a perspective view of a robot hand according to still another embodiment of the present invention.

FIG. 6 shows a perspective view of a robot hand according to still another embodiment of the present invention. In the embodiment, an optical fiber sensor is used as the wafer position sensor.

The construction of the robot hand of FIG. 6 is substantially identical with that of FIG. 1.

The robot main body 1 is connected to the robot hand arm 104. The vacuum passages 4 and 6 are connected to vacuum conducting pipes 121 and 122 in the robot hand arm 104, respectively, through joint portions 112. The ends of the vacuum conducting pipes 121 and 122 are connected to a vacuum producing mechanism including at least one vacuum pump. The optical fiber sensor 120 is provided at the position of the main body 1 which is not in contact with the wafer seat plate 2 in the same manner as shown in FIGS. 2 and 3.

The end of the robot arm 104 is connected to a sensing arm 113' including a groove sensing sensor 113. The position of each of the grooves of the diffusion boat 106 is judged by the groove sensor 113 when the semiconductor wafer 110 is stored into the groove of the diffusion boat 106. The output of the groove sensor 113 is sent to the control circuit, for example, for the robot hand or the robot hand arm of the robot to thereby control the position of the robot hand 105, so that the semiconductor wafer 110 is exactly stored into the groove of the diffusion boat 106.

The robot hand having the wafer position sensing means according to the present invention is effectively applied to the loading/unloading device for a damageable member such as a semiconductor wafer.

As described above, when the semiconductor wafer is held on the wafer seat plate by the vacuum producing mechanism, at least one wafer position sensor such as the reflection type photosensor or the optical fiber sensor provided with the robot hand main body judges whether the held semiconductor wafer is present or absent at the correct position on the wafer seat plate. If the absorbed semiconductor wafer is absent from the correct position, the operation controller, such as a microcomputer, for the robot hand or the robot hand arm of the robot receives the detecting signals from the sensor to thereby stop the operation of the operation controller, so that the robot hand of the robot is stopped operating. After stopping the operation of the robot, the semiconductor wafer is held again on the wafer seat plate or the position of the held semiconductor wafer is rectified by a rectifying mechanism (not shown). Because the wafer position sensor is provided for detecting whether the semiconductor wafer is present or absent at the correct position on the wafer seat plate, the semiconductor wafer may not be damaged or fine dust may not be produced by damaging the wafer.

The number of wafer position sensors should not be limited to one or three as shown. The number of wafer position sensors may be other than one or three.

Although the shape of the robot hand of the present invention is formed in the stair form, the shape of the robot hand may be changed to various types.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A robot for transporting a semiconductor wafer comprising:
   robot hand means for engaging and retaining a semiconductor wafer,
   said robot hand means including first support means for supporting the retained semiconductor wafer and second support means for supporting said first support means,
   position sensing means located on said second support means for detecting the presence and exact position of the semiconductor wafer on said robot hand means,
   said position sensing means including first sensor means and second sensor means,
   said first sensor means including first and second sensors spaced apart and positioned so as to not be covered by the semiconductor wafer in its correct position,
   said first and second sensors each having a center,
   said second sensor means including a third sensor equidistant from said first and second sensors and spaced from a line drawn between said centers of said first and second sensors and positioned so as to be covered by the semiconductor wafer in its correct position, and
   said first sensor means and said second sensor means together indicating if the semiconductor wafer is present and in a correct position.

2. The robot of claim 1, wherein said second support means has a projection for supporting said first support means.

3. The robot of claim 2, wherein said first support means has a hole perforated through said first support means and said projection of said second support means is inserted into said hole of said first support means to support said first support means on said second support means.

4. The robot of claim 2, wherein said projection of said second supporting means has a cavity portion connected to vacuum producing means so that the semiconductor wafer is held by vacuum over said projection of said second support means.

5. The robot of claim 1, wherein said second support means has a groove connected to vacuum producing means so that said first support means is held by vacuum on said second support means through said groove.

6. The robot of claim 1 wherein said robot hand means is formed with portions at right angles to each other.

7. The robot of claim 1, wherein each said sensor means is an optical fiber sensor.

8. The robot of claim 1, wherein each said sensor means is a photosensor.

* * * * *